(12) United States Patent
Oh et al.

(10) Patent No.: US 10,388,663 B2
(45) Date of Patent: Aug. 20, 2019

(54) WIRING LINE STRUCTURE OF THREE-DIMENSIONAL MEMORY DEVICE

(71) Applicant: SK hynix Inc., Gyeonggi-do (KR)

(72) Inventors: Sung-Lae Oh, Chungcheongbuk-do (KR); Dong-Hyuk Kim, Seoul (KR); Soo-Nam Jung, Seoul (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 15/878,806

(22) Filed: Jan. 24, 2018

(65) Prior Publication Data

US 2019/0067316 A1 Feb. 28, 2019

(30) Foreign Application Priority Data

Aug. 22, 2017 (KR) ........................ 10-2017-0105782

(51) Int. Cl.
| | |
|---|---|
| *H01L 27/11582* | (2017.01) |
| *H01L 23/528* | (2006.01) |
| *G11C 16/08* | (2006.01) |
| *H01L 29/10* | (2006.01) |
| *H01L 29/06* | (2006.01) |
| *H01L 27/11521* | (2017.01) |
| *H01L 27/11526* | (2017.01) |
| *H01L 27/11556* | (2017.01) |
| *H01L 27/11568* | (2017.01) |
| *H01L 27/11573* | (2017.01) |
| *G11C 16/04* | (2006.01) |
| *G11C 16/26* | (2006.01) |
| *G11C 16/10* | (2006.01) |

(Continued)

(52) U.S. Cl.
CPC .... *H01L 27/11582* (2013.01); *G11C 16/0408* (2013.01); *G11C 16/0466* (2013.01); *G11C 16/08* (2013.01); *G11C 16/10* (2013.01); *G11C 16/26* (2013.01); *H01L 23/528* (2013.01); *H01L 27/11521* (2013.01); *H01L 27/11526* (2013.01); *H01L 27/11556* (2013.01); *H01L 27/11568* (2013.01); *H01L 27/11573* (2013.01); *H01L 29/0649* (2013.01); *H01L 29/1037* (2013.01); *H01L 29/1095* (2013.01); *H01L 27/11519* (2013.01); *H01L 27/11565* (2013.01)

(58) Field of Classification Search
None
See application file for complete search history.

(56) References Cited

U.S. PATENT DOCUMENTS

| | | | | |
|---|---|---|---|---|
| 2011/0121403 A1* | 5/2011 | Lee | ................... | H01L 27/11526 257/390 |
| 2013/0127011 A1* | 5/2013 | Higashitani | ....... | H01L 27/11565 257/532 |

(Continued)

FOREIGN PATENT DOCUMENTS

| | | |
|---|---|---|
| KR | 1020160045340 | 4/2016 |
| KR | 1020160108052 | 9/2016 |

*Primary Examiner* — J. H. Hur
(74) *Attorney, Agent, or Firm* — IP & T Group LLP

(57) ABSTRACT

A memory device includes a substrate, channel structures disposed over the substrate and extending in a first direction perpendicular to a top surface of the substrate, a plurality of gate lines surrounding the channel structures and stacked over the substrate along the first direction, and a wiring line disposed at the same layer as at least one of the gate lines.

14 Claims, 13 Drawing Sheets

(51) Int. Cl.
*H01L 27/11565* (2017.01)
*H01L 27/11519* (2017.01)

(56) References Cited

U.S. PATENT DOCUMENTS

2014/0241026 A1\* 8/2014 Tanzawa ................. G11C 5/063
　　　　　　　　　　　　　　　　　　　　　365/72
2017/0053923 A1\* 2/2017 Hwang ............. H01L 27/11582

\* cited by examiner

US 10,388,663 B2

WIRING LINE STRUCTURE OF THREE-DIMENSIONAL MEMORY DEVICE

CROSS-REFERENCE TO RELATED APPLICATION

The present application claims priority to Korean Patent Application No. 10-2017-0105782 filed on Aug. 22, 2017, which is incorporated herein by reference in its entirety.

BACKGROUND

1. Technical Field

Various embodiments generally relate to a memory device, and, more particularly, to a memory device including a memory cell array of a three-dimensional structure.

2. Related Art

A semiconductor memory device is a memory device which is realized using a semiconductor such as silicon (Si), germanium (Ge), gallium arsenide (GaAs) and indium phosphide (InP). Semiconductor memory devices are generally classified into a volatile memory device and a nonvolatile memory device.

A volatile memory device is a memory device which loses stored data when power supply is interrupted. A volatile memory device includes a static RAM (SRAM), a dynamic RAM (DRAM) and a synchronous DRAM (SDRAM). A nonvolatile memory device is a memory device which retains stored data even when power supply is interrupted. A nonvolatile memory device includes a flash memory device, a read only memory (ROM), a programmable ROM (PROM), an electrically programmable ROM (EPROM), an electrically erasable and programmable ROM (EEPROM) and a resistive memory device (for example, a phase change RAM (PRAM), a ferroelectric RAM (FRAM) and a resistive RAM (RRAM).

In order to meet excellent performance and low cost that consumers demand, the degree of integration of a nonvolatile memory device is increasing. In the case of a two-dimensional or planar memory device, the degree of integration is determined by the area occupied by a unit memory cell. Therefore, recently, a memory device of a three-dimensional structure in which unit memory cells are disposed in the vertical direction has been developed.

SUMMARY

In an embodiment, a memory device may include: a substrate; channel structures disposed over the substrate and extending in a first direction perpendicular to a top surface of the substrate; a plurality of gate lines stacked over the substrate along the first direction, the gate lines surrounding the channel structures; and at least one wiring line disposed at the same layer as at least one of the gate lines.

In an embodiment, a memory device may include: a substrate; and a memory block stacked over the substrate in a first direction perpendicular to a top surface of the substrate, the memory block including channel structures extending in the first direction; at least one source select line, a plurality of word lines and at least one drain select line surrounding the channel structures and stacked along the first direction; and a wiring line disposed at the same layer as the drain select line.

In an embodiment, a memory device may include: a substrate; and a memory cell array stacked over the substrate in a first direction perpendicular to a top surface of the substrate. The memory cell array includes a memory block including channel structures which extend in the first direction and a plurality of gate lines which surround the channel structures and are stacked over the substrate along the first direction; and a wiring line stack including a plurality of wiring lines which are stacked over the substrate along the first direction and are disposed at the same layers as the gate lines, respectively.

DETAILED DESCRIPTION

Hereinafter, a memory device of a three-dimensional structure will be described below with reference to the accompanying drawings through various examples of embodiments.

Figure 1:
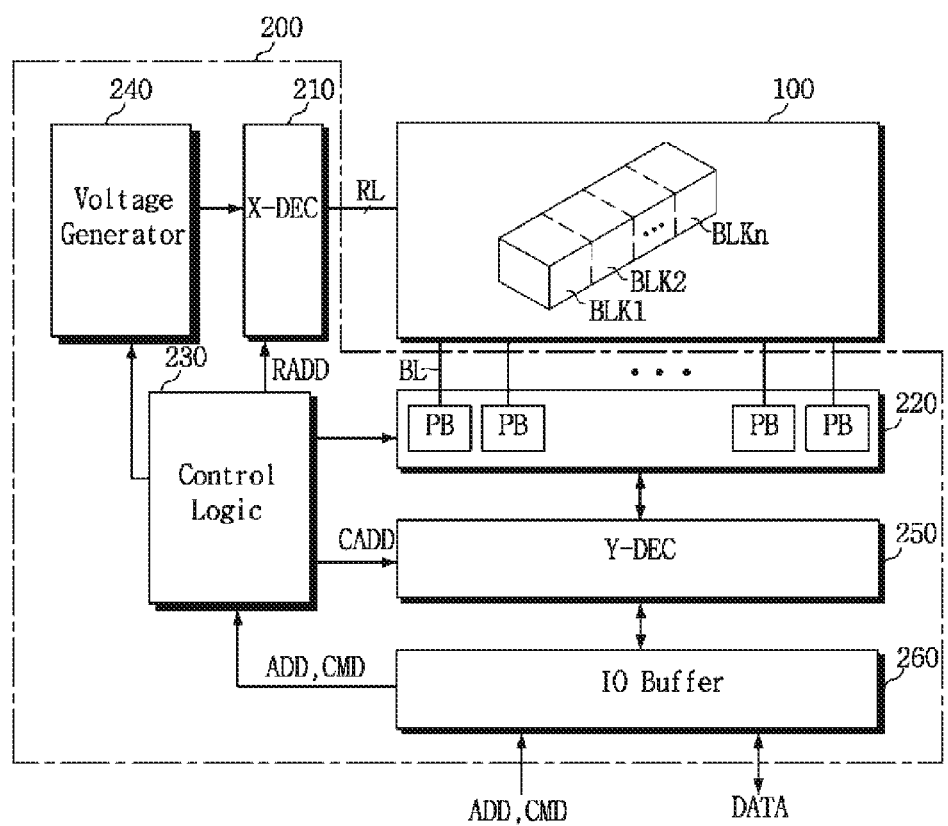
FIG. 1 is a block diagram illustrating a representation of an example of a memory device in accordance with an embodiment.

FIG. 1 is a block diagram illustrating a representation of an example of a memory device in accordance with an embodiment.

Referring to FIG. 1, the memory device in accordance with an embodiment may include a memory cell array 100 and a peripheral circuit 200. The peripheral circuit 200 may include a row decoder 210, a page buffer circuit 220, a control logic 230, a voltage generator 240, a column decoder 250 and an input/output buffer 260.

The memory cell array 100 may include a plurality of memory blocks BLK1 to BLKn. Each of the memory blocks BLK1 to BLKn may include a plurality of cell strings arranged in a 3-D configuration. Each of the cell strings may include a plurality of memory cells which are stacked in series on a substrate. In an embodiment, the memory cells may be nonvolatile memory cells.

The memory cell array 100 may be coupled to the row decoder 210 through a plurality of row lines RL. The row lines RL may include at least one drain select line, a plurality of word lines and at least one source select line. The memory cell array 100 may be coupled to the page buffer circuit 220 through a plurality of bit lines BL. A plurality of row lines RL may be coupled to each of the memory blocks BLK1 to BLKn. The plurality of bit lines BL may be coupled in common to the plurality of memory blocks BLK1 to BLKn.

The row decoder 210 may select any one among the memory blocks BLK1 to BLKn of the memory cell array 100, in response to a row address RADD provided from the control logic 230. The row decoder 210 may transfer operation voltages from the voltage generator 240, for example, a program voltage (Vpgm), a pass voltage (Vpass) and a read voltage (Vread), to the row lines RL coupled to a selected memory block. In particular, in a program operation, an operation voltage of a high level should be provided to the word lines of a selected memory block. In order to transfer a high voltage, the row decoder 210 may include pass transistors which are constructed by high voltage transistors.

The page buffer circuit 220 may include a plurality of page buffers PB which are coupled to the memory cell array 100 through the bit lines BL. The page buffers PB may operate as write drivers or sense amplifiers depending on an operation mode. In a program operation, the page buffers PB may latch data DATA received through the input/output buffer 260 and the column decoder 250 and apply voltages necessary for storing the data DATA in selected memory cells, to the bit lines BL in response to a control signal from the control logic 230. In a read operation, the page buffers PB may read out data DATA stored in selected memory cells, through the bit lines BL, and output the read-out data DATA to an exterior through the column decoder 250 and the input/output buffer 260. In an erase operation, the page buffers PB may float the bit lines BL.

The control logic 230 may control the page buffer circuit 220 and the voltage generator 240 to access selected memory cells, in response to a command CMD and an address ADD received through the input/output buffer 260. The control logic 230 may output a row address RADD from the address ADD to the row decoder 210, and a column address CADD from the address ADD to the column decoder 250.

The voltage generator 240 may generate various voltages required in the memory device. For example, the voltage generator 240 may generate a program voltage, a pass voltage, a select read voltage and an unselect read voltage.

The column decoder 250 may input program data to the page buffer circuit 220 in response to the column address CADD from the control logic 230.

Hereinbelow, in the accompanying drawings, a direction vertically projecting from the top surface of a substrate is defined as a first direction FD, and two directions parallel to the top surface of the substrate and intersecting with each other are defined as a second direction SD and a third direction TD, respectively. The second direction SD and the third direction TD may intersect substantially perpendicularly with each other. In the drawings, a direction indicated by an arrow and a direction opposite thereto represent the same direction.

Figure 2:
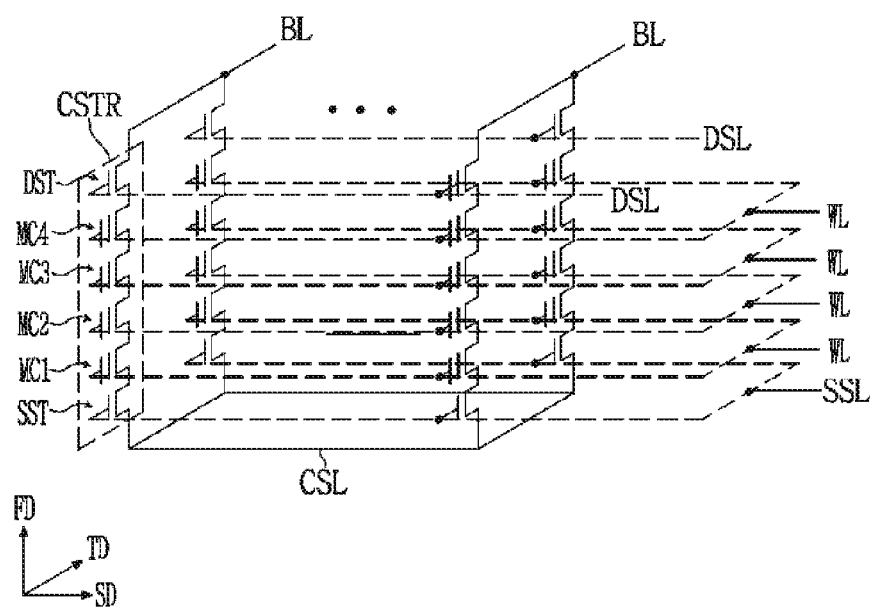
FIG. 2 is a circuit diagram illustrating a representation of an example of one of the memory blocks shown in FIG. 1.

FIG. 2 is a circuit diagram illustrating a representation of an example of any one of the memory blocks shown in FIG. 1.

Referring to FIG. 2, a memory block BLKi may include a plurality of cell strings CSTR which are coupled between a plurality of bit lines BL and a common source line CSL. The cell strings CSTR may be formed in the first direction FD.

A source select line SSL, word lines WL and a drain select line DSL may be stacked in the first direction FD between the common source line CSL and the bit lines BL. The source select line SSL, the word lines WL and the drain select line DSL may extend in the second direction SD.

The bit lines BL may be arranged along the second direction SD and may extend along the third direction TD. A plurality of cell strings CSTR may be coupled in parallel to each of the bit lines BL. The cell strings CSTR may be coupled in common to the common source line CSL. That is, a plurality of cell strings CSTR may be coupled between the plurality of bit lines BL and one common source line CSL.

Each of the cell strings CSTR may include a source select transistor SST which is coupled to the common source line CSL, a drain select transistor DST which is coupled to a corresponding bit line BL, and a plurality of memory cells MC1 to MC4 which are coupled between the source select transistor SST and the drain select transistor DST. The source select transistor SST, the memory cells MC1 to MC4 and the drain select transistor DST may be coupled in series along the first direction FD.

The gates of source select transistors SST may be coupled to the source select line SSL. The gates of the memory cells MC1 to MC4 may be coupled to corresponding word lines WL, respectively. The gates of drain select transistors DST may be coupled to corresponding drain select lines DSL, respectively.

While it is illustrated in the embodiment of FIG. 2 that four word lines WL are stacked, it is to be noted that the stack number of word lines is not limited thereto. For example, 8, 16, 32 or 64 word lines may be stacked along the first direction FD.

While it is illustrated in the embodiment of FIG. 2 that the source select lines SSL are disposed at one layer in the first direction FD, and the drain select lines DSL are disposed at one layer in the first direction FD, it is to be noted that source select lines SSL or/and drain select lines DSL may include at least two layers in the first direction FD.

Figure 3:
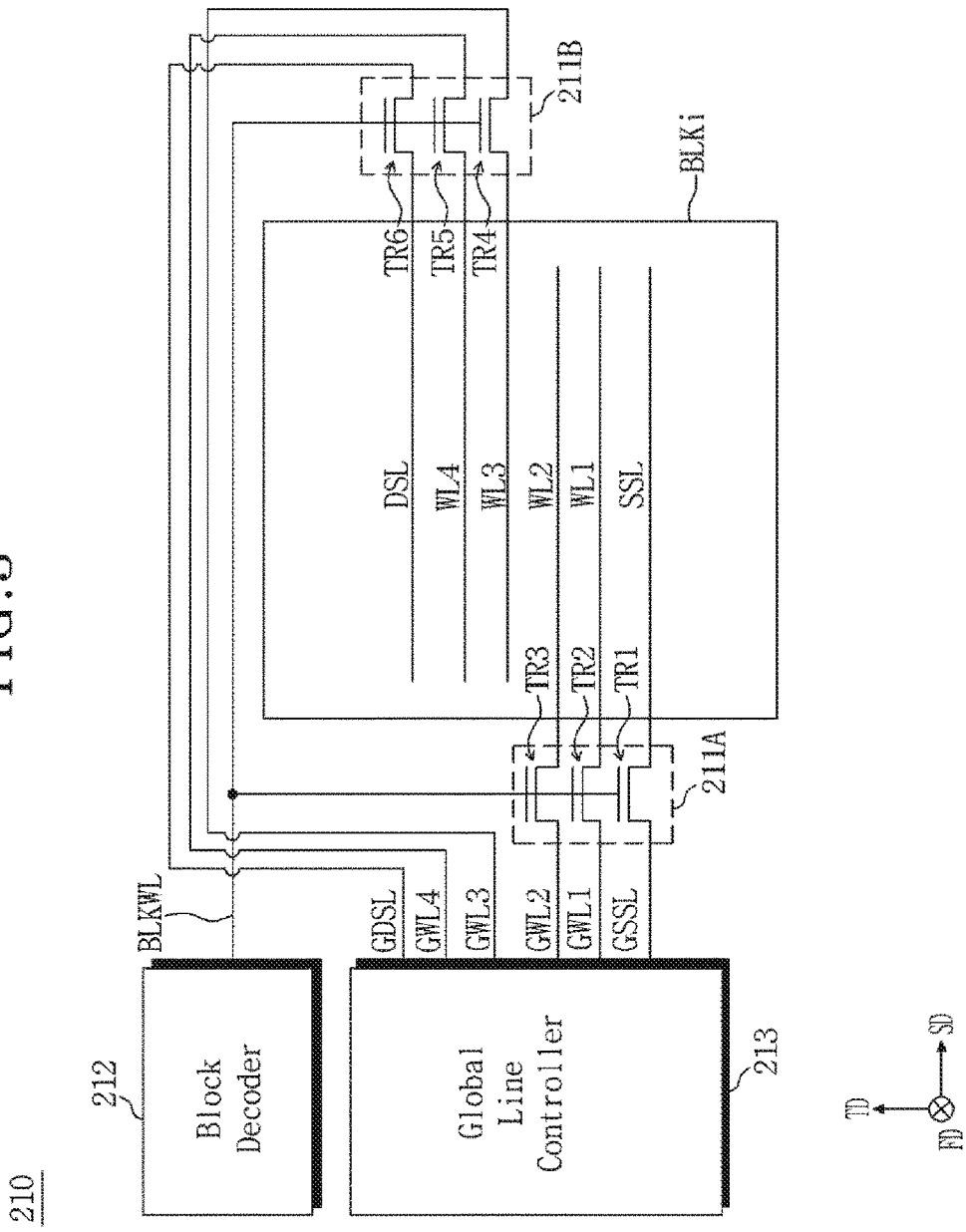
FIG. 3 is a circuit diagram illustrating a representation of an example of the schematic configurations of the memory block and the row decoder of the memory device in accordance with an embodiment.

FIG. 3 is a circuit diagram illustrating a representation of an example of the schematic configurations of the memory block and the row decoder of the memory device in accordance with the embodiment.

Referring to FIG. 3, the row decoder 210 may include first and second pass transistor circuits 211A and 211B, a block decoder 212 and a global line controller 213.

The first and second pass transistor circuits 211A and 211B may be provided for each of the memory blocks BLK1 to BLKn (see FIG. 1). The block decoder 212 and the global line controller 213 may be provided in common for the memory blocks BLK1 to BLKn.

The first pass transistor circuit 211A, the block decoder 212 and the global line controller 213 may be disposed at one side of the memory block BLKi in the second direction SD, that is, at the left side of the memory block BLKi on the drawing, and the second pass transistor circuit 211B may be disposed at the other side of the memory block BLKi in the second direction SD, that is, at the right side of the memory block BLKi on the drawing.

The first pass transistor circuit 211A may include a plurality of pass transistors, for example, three transistors TR1 to TR3. The pass transistors TR1 to TR3 may couple a source select line SSL and word lines WL1 and WL2 to corresponding global row lines GSSL, GWL1 and GWL2. A global source select line GSSL may be coupled to the drain of the pass transistor TR1, and the source select line SSL may be coupled to the source of the pass transistor TR1. The pass transistor TR1 may transfer the voltage applied to the global source select line GSSL to the source select line SSL. Global word lines GWL1 and GWL2 may be coupled to the drains of the pass transistors TR2 and TR3, respectively, and the word lines WL1 and WL2 may be coupled to the sources of the pass transistors TR2 and TR3, respectively. The pass transistors TR2 and TR3 may transfer the voltages applied to the global word lines GWL1 and GWL2 to the word lines WL1 and WL2.

The second pass transistor circuit 211B may include a plurality of pass transistors, for example, three transistors TR4 to TR6. The pass transistors TR4 to TR6 may couple word lines WL3 and WL4 and a drain select line DSL to corresponding global row lines GWL3, GWL4 and GDSL. Global word lines GWL3 and GWL4 may be coupled to the drains of the pass transistors TR4 and TR5, respectively, and the word lines WL3 and WL4 may be coupled to the sources of the pass transistors TR4 and TR5, respectively. The pass transistors TR4 and TR5 may transfer the voltages applied to the global word lines GWL3 and GWL4 to the word lines WL3 and WL4, respectively. A global drain select line GDSL may be coupled to the drain of the pass transistor TR6, and the drain select line DSL may be coupled to the source of the pass transistor TR6. The pass transistor TR6 may transfer the voltage applied to the global drain select line GDSL to the drain select line DSL.

The block decoder 212 may be coupled to the first and second pass transistor circuits 211A and 211B through a block word line BLKWL. The block decoder 212 may be provided with a block select signal from the voltage generator 240 (see FIG. 1), and may transfer the block select signal provided from the voltage generator 240, to the first and second pass transistor circuits 211A and 211B through the block word line BLKWL in response to the control of the control logic 230 (see FIG. 1).

The global line controller 213 may be coupled to the first and second pass transistor circuits 211A and 211B through the global row lines GSSL, GWL1 to GWL4 and GDSL. The global line controller 213 may be provided with operation voltages from the voltage generator 240, and may transfer the operation voltages provided from the voltage generator 240, to the first and second pass transistor circuits 211A and 211B through the global row lines GSSL, GWL1 to GWL4 and GDSL in response to the control of the control logic 230.

The pass transistors TR1 to TR6 of the first and second pass transistors 211A and 211B may electrically couple the global row lines GSSL, GWL1 to GWL4 and GDSL and the row lines SSL, WL1 to WL4 and DSL in response to the block select signal from the block decoder 212, and may transfer the operation voltages applied to the global row lines GSSL, GWL1 to GWL4 and GDSL to the row lines SSL, WL1 to WL4 and DSL.

Figure 4:
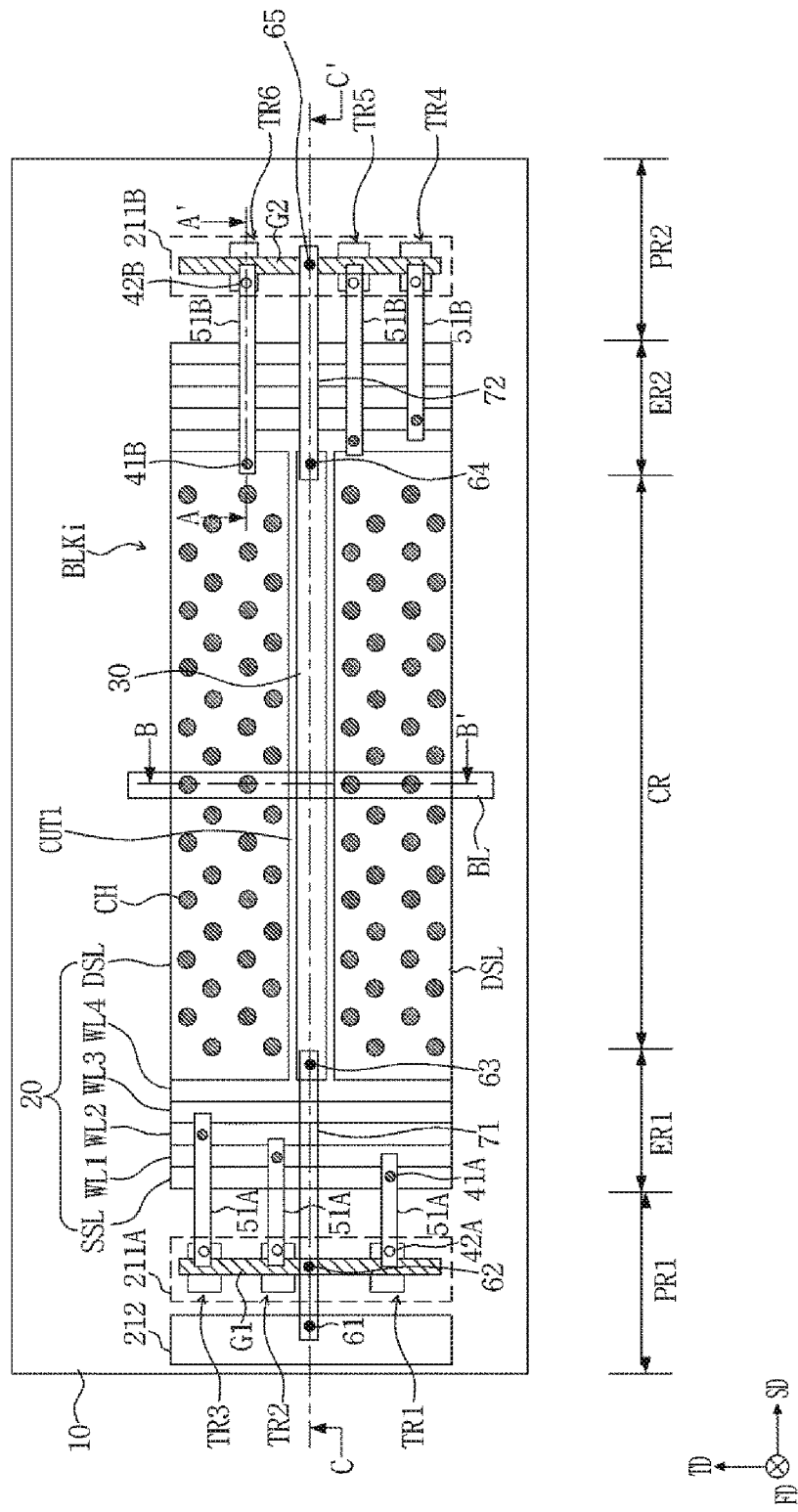
FIG. 4 is a top view illustrating a representation of an example of the memory device in accordance with an embodiment.

FIG. 4 is a top view illustrating a representation of an example of a portion of the memory device in accordance with an embodiment.

Referring to FIG. 4, the memory device or substrate 10 may include a cell region CR, extended regions ER1 and ER2 and peripheral regions PR1 and PR2.

The extended regions ER1 and ER2 may be disposed adjacent to both edges of the cell region CR in the second direction SD. Hereinbelow, for the sake of convenience in explanation, an extended region which is disposed adjacent to the left edge of the cell region CR will be defined as a first extended region ER1, and an extended region which is disposed adjacent to the right edge of the cell region CR will be defined as a second extended region ER2.

The peripheral regions PR1 and PR2 may include a first peripheral region PR1 and a second peripheral region PR2. The first peripheral region PR1 may be disposed adjacent to the first extended region ER1 at a periphery of the substrate 10 in the second direction SD, and the second peripheral region PR2 may be disposed adjacent to the second extended region ER2 at a periphery of the substrate 10 in the second direction SD.

A memory block BLKi may be disposed in the cell region CR and the first and second extended regions ER1 and ER2. While FIG. 4 illustrates only one memory block for the sake of simplification in illustration, it is to be noted that a plurality of memory blocks included in the memory cell array 100 (see FIG. 1) may be provided in the cell region CR and the first and second extended regions ER1 and ER2 along the third direction TD.

The memory block BLKi may include a plurality of channel structures CH which extend in the first direction FD, a plurality of gate lines 20 which surround the channel structures CH and are stacked along the first direction FD, and a wiring line 30 which is disposed at the same layer as at least one of the gate lines 20.

The channel structures CH may be disposed in the cell region CR. The channel structures CH may be disposed in such a way as to be separated from one another along the second direction SD and the third direction TD. The channel structures CH may be disposed in a zigzag style along the third direction.

The gate lines 20 may be disposed in the cell region CR and the first and second extended regions ER1 and ER2, and may be extended in the second direction SD. The gate lines 20 may traverse the cell region CR in the second direction SD so that one end of each one of the gate lines 20 is disposed in the first extended region ER1 and the other end is disposed in the second extended region ER2.

The gate lines 20 may include at least one source select line SSL, a plurality of word lines WL1 to WL4 and at least one drain select line DSL which are sequentially stacked along the first direction FD.

The gate lines 20 may extend by different lengths along the second direction SD, and thus, may form first and second step portions in the first and second extended regions ER1 and ER2, i.e., portions that have the form of steps from a side cross-sectional view. See FIG. 5.

In an embodiment, the wiring line 30 may be disposed at the same layer as the drain select line DSL. The drain select line DSL and the wiring line 30 may be separated from each other by a cutting pattern CUT1 which extends in the second direction SD. As shown in FIG. 4, in the case where two cutting patterns CUT1 are formed, two drain select lines DSL and one wiring line 30 may be defined in one layer. The numbers of the cutting patterns CUT1, the drain select lines DSL and the wiring line 30 illustrated in FIG. 4 are for an illustration purpose only, and it is to be noted that the embodiment is not limited thereto.

The wiring line 30 may be disposed in the cell region CR and the first and second extended regions ER1 and ER2, and may extend in the second direction SD. The wiring line 30 may traverse the cell region CR along the second direction SD so that one end of the wiring line 30 may be disposed in the first extended region ER1 and the other end may be disposed in the second extended region ER2.

A bit line BL may be disposed on the cell region CR. The bit line BL may extend in the third direction TD. The channel structures CH which are disposed in a line along the third direction TD may be electrically coupled to a single bit line BL. While only one bit line BL is illustrated in FIG. 4 for the sake of simplification in illustration, it is to be noted that a plurality of bit lines are arranged along the second direction SD.

The first pass transistor circuit 211A and the block decoder 212 may be disposed in the first peripheral region PR1, and the second pass transistor circuit 211B may be disposed in the second peripheral region PR2. While not shown, the global line controller 213 (see FIG. 3) may be additionally disposed in the first peripheral region PR1.

Local row lines 51A may be coupled to the left step portions, respectively, of the source select line SSL and the word lines WL1 and WL2 through contacts 41A. The local row lines 51A may extend from the first extended region ER1 to the first peripheral region PR1 along the second direction SD. The local row lines 51A may be coupled to the sources of the pass transistors TR1 to TR3 included in the first pass transistor circuit 211A, through contacts 42A.

Local row lines 51B may be coupled to the right step portions, respectively, of the word lines WL3 and WL4 and the drain select line DSL through contacts 41B. The local row lines 51B may extend from the second extended region ER2 to the second peripheral region PR2 along the second direction SD. The local row lines 51B may be coupled to the sources of the pass transistors TR4 to TR6 included in the second pass transistor circuit 211B, through contacts 42B.

In an embodiment, the pass transistors TR1 to TR3 included in the first pass transistor circuit 211A may share one gate electrode G1. Similarly, the pass transistors TR4 to TR6 included in the second pass transistor circuit 211B may also share one gate electrode G2.

A contact 61 may be formed on the block decoder 212. The block decoder 212 may be electrically coupled to a first top wiring line 71 through the contact 61. The first top wiring line 71 may extend from the first peripheral region PR1 to the first extended region ER1 along the second direction SD, and may be disposed to overlap, in the first direction FD, with a portion of the gate electrode G1 of the pass transistors TR1 to TR3 included in the first pass transistor circuit 211A and one end of the wiring line 30 disposed on the first extended region ER1.

A contact 62 which extends in the first direction FD may be formed at the overlapping portion between the first top wiring line 71 and the gate electrode G1. The gate electrode G1 may be coupled to the top wiring line 71 through the contact 62. A contact 63 which extends in the first direction FD may be formed at the overlapping portion between the first top wiring line 71 and the wiring line 30. The wiring line 30 may be coupled to the first top wiring line 71 through the contact 63.

The other end of the wiring line 30 which is disposed on the second extended region ER2 may be coupled to a second top wiring line 72 through a contact 64. The second top wiring line 72 may extend from the second extended region ER2 to the second peripheral region PR2 along the second direction SD, and may be disposed to overlap, in the first direction FD, with a portion of the gate electrode G2 of the pass transistors TR4 to TR6 included in the second pass transistor circuit 211B. A contact 65 which extends in the first direction FD may be formed at the overlapping portion between the second top wiring line 72 and the gate electrode G2. The gate electrode G2 may be electrically coupled to the second top wiring line 72 through the contact 65.

By these structures, the gate electrode G1 of the pass transistors TR1 to TR3 may be electrically coupled to the block decoder 212 through the contact 62, the first top wiring line 71 and the contact 61. Further, the gate electrode G2 of the pass transistors TR4 to TR6 may be electrically coupled to the block decoder 212 through the contact 65, the second top wiring line 72, the contact 64, the wiring line 30, the contact 63, the first top wiring line 71 and the contact 61.

Figure 5:
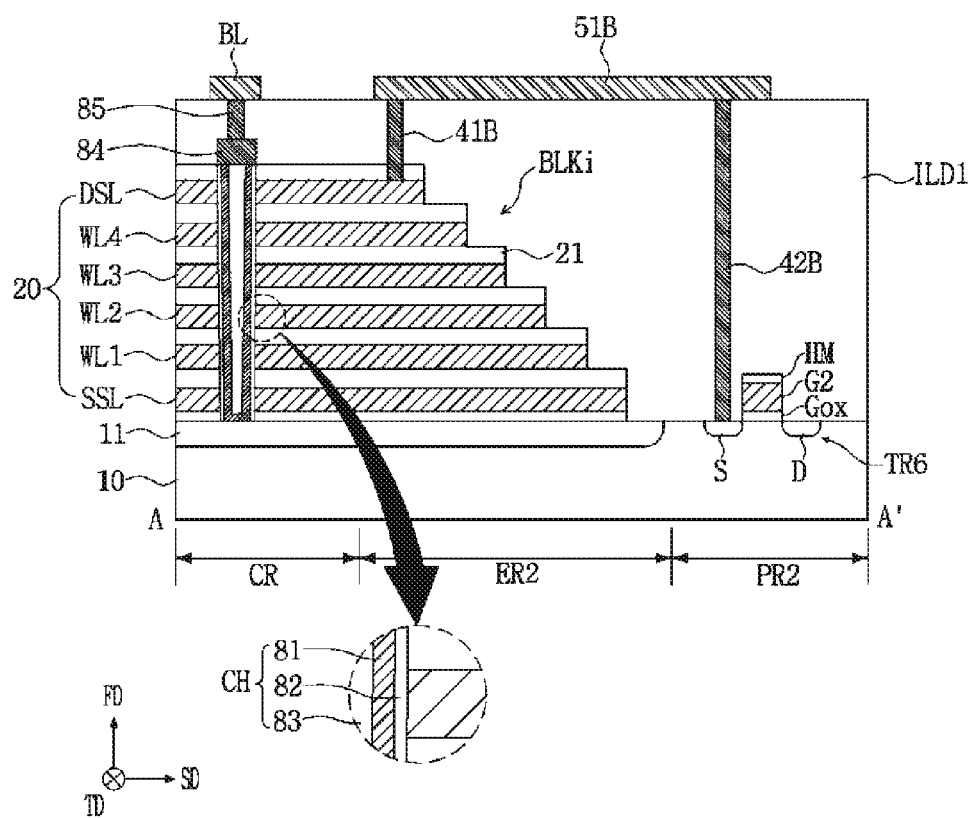
FIG. 5 is a cross-sectional view taken along the line A-A' of FIG. 4.
Figure 6:
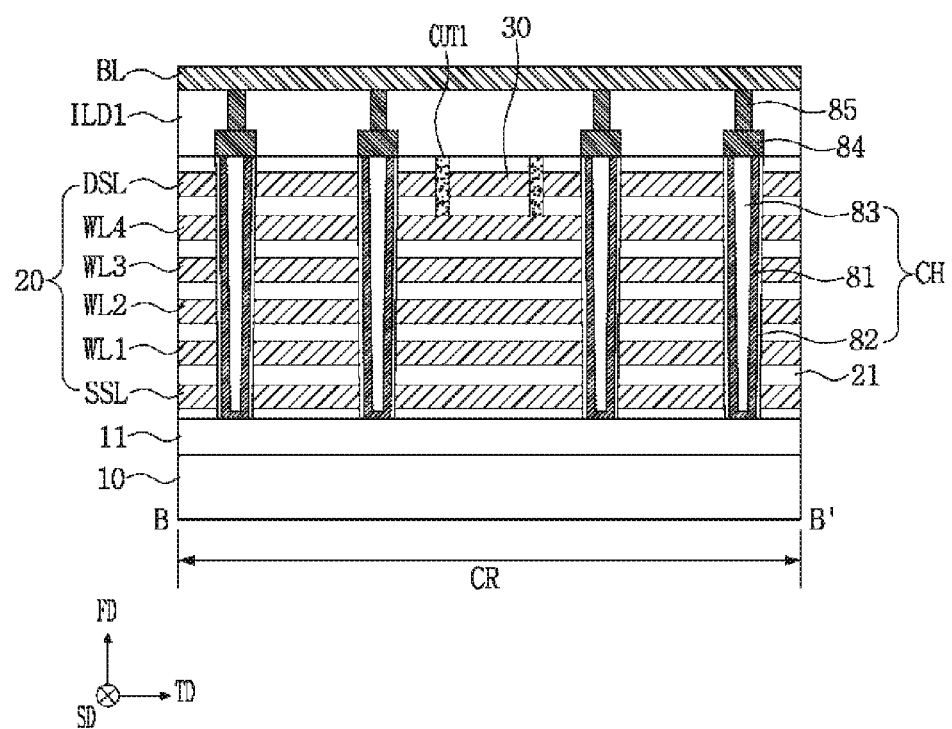
FIG. 6 is a cross-sectional view taken along the line B-B' of FIG. 4.
Figure 7:
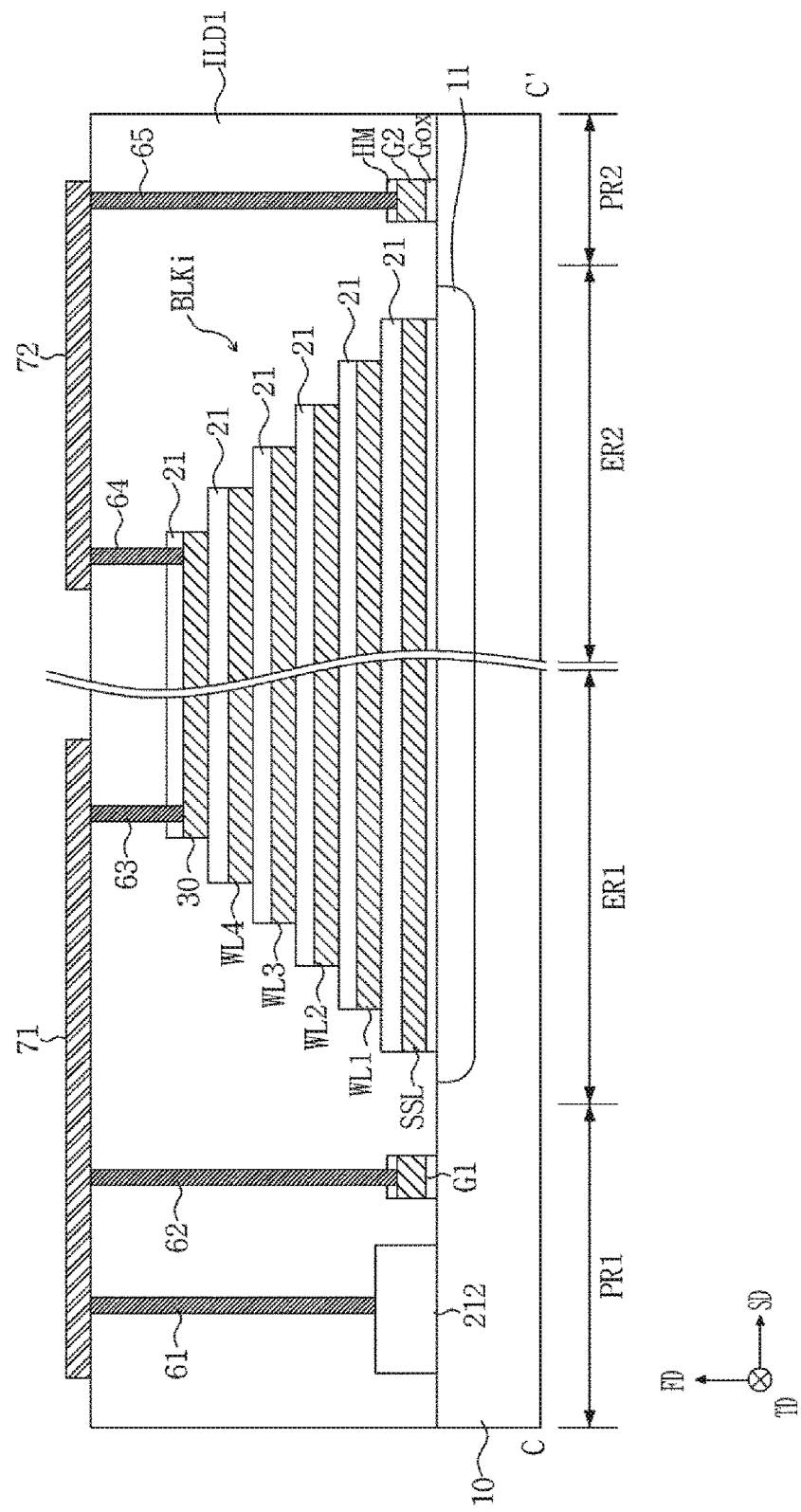
FIG. 7 is a cross-sectional view taken along the line C-C' of FIG. 4.

Hereunder, the components of the memory device in accordance with an embodiment of the present disclosure will be described in further detail with additional reference to FIGS. 5 to 7. FIG. 5 is a cross-sectional view taken along the line A-A' of FIG. 4 in the second direction SD, FIG. 6 is a cross-sectional view taken along the line B-B' of FIG. 4 in the third direction TD, and FIG. 7 is a cross-sectional view taken along the line C-C' of FIG. 4 in the second direction SD.

Referring to FIGS. 4 to 7, the substrate 10 may include Si, Ge or SiGe. The substrate 10 may include a polysilicon substrate, a silicon-on-insulator (SOI) substrate or a germanium-on-insulator (GeOI) substrate.

A well region 11 may be formed in the substrate 10. The well region 11 may be disposed in the cell region CR and the first extended region ER1. While not shown, the well region 11 may also be disposed in the second extended region ER2. The well region 11 may be disposed in only the cell region CR and may not be disposed in the first and second peripheral regions PR1 and PR2. The well region 11 may be a P-type well which is doped with a P-type impurity. The well region 11 may be an N-type well which is doped with an N-type impurity. The well region 11 may be realized as a P-type well and an N-type well overlap in the first direction FD.

The memory block BLKi may be disposed in the cell region CR and the first and second extended regions ER1 and ER2 of the substrate 10. The memory block BLKi may include the plurality of channel structures CH which extend in the first direction FD, the gate lines 20 and first dielectric layers 21 which surround the channel structures CH and are alternately stacked along the first direction FD on the substrate 10, and the wiring line 30 which is disposed at the same layer as at least one of the gate lines 20.

The channel structures CH may be disposed in the cell region CR of the substrate 10. Each of the channel structures CH may include the channel layer 81 and a gate dielectric layer 82 which is disposed between the channel layer 81 and the gate lines 20. The channel layer 81 may include a polysilicon or monocrystalline silicon, and may include a P-type impurity such as boron (B) in some regions.

The channel layer 81 may have the shape of a tube in which a center region is open. A buried dielectric layer 83 may be formed in the open center region of the channel layer 81. The buried dielectric layer 83 may include a dielectric material such as a silicon oxide. In an embodiment, the channel layer 81 may have the shape of a pillar which is completely filled up to its center or a solid cylinder, and in this case, the buried dielectric layer 83 may be omitted.

The gate dielectric layer 82 may have the shape of a straw or a cylindrical shell which surrounds the outer wall of the channel layer 81. While not shown, the gate dielectric layer 82 may include a tunnel dielectric layer, a charge storage layer and a blocking layer which are sequentially stacked from the outer wall of the channel layer 81. The tunnel dielectric layer may include a silicon oxide, a hafnium oxide, an aluminum oxide, a zirconium oxide or a tantalum oxide. The charge storage layer may include a silicon nitride, a boron nitride, a silicon boron nitride or a polysilicon doped with an impurity. The blocking layer may include a single layer or a stack layer of a silicon oxide, a silicon nitride, a hafnium oxide, an aluminum oxide, a zirconium oxide and a tantalum oxide. In some embodiments, the gate dielectric layer 82 may have an ONO (oxide-nitride-oxide) stack structure in which an oxide layer, a nitride layer and an oxide layer are sequentially stacked.

The gate lines 20 may be disposed in the cell region CR and the first and second extended regions ER1 and ER2 of the substrate 10. The gate lines 20 may include at least one source select line SSL, a plurality of word lines WL and at least one drain select line DSL. The source select line SSL, the word lines WL and the drain select line DSL may be sequentially stacked along the first direction FD. The gate lines 20 may include a metallic material or a polysilicon.

Source select transistors SST (see FIG. 2) may be formed where the source select line SSL surrounds the channel structures CH, memory cells MC (see FIG. 2) may be formed where the word lines WL surround the channel structures CH, and drain select transistors DST (see FIG. 2) may be formed where the drain select line DSL surrounds the channel structures CH. By the above-described structure, cell strings each including a source select transistor, memory cells and a drain select transistor which are disposed along each of the channel structures CH may be provided.

The gate lines 20 may be stacked in a shape of which length along the second direction SD gradually decreases from the top surface of the substrate 10. For example, as shown in FIGS. 5 and 7, the gate lines 20 may be stacked in a step-like shape or a pyramid shape. Due to this fact, on the first and second extended regions ER1 and ER2, each of the gate lines 20 may have step portions which project out of the gate line 20 of an upper layer in the second direction SD.

In an embodiment, the wiring line 30 may be disposed at the same layer as the drain select line DSL. The drain select line DSL and the wiring line 30 may be separated by the cutting pattern CUT1 which extends in the second direction SD. The cutting pattern CUT1 may be constructed by a dielectric layer such as a silicon oxide layer.

The drain select line DSL and the wiring line 30 which are disposed at the same layer may be formed at the same processing step. Due to this fact, the heights and materials of the drain select line DSL and the wiring line 30 which are disposed at the same layer may be the same with each other.

The wiring line 30 may be stacked on the uppermost word line WL4, and may overlap with the word lines WL1 to WL4 and the source select line SSL in the first direction FD. The wiring line 30 may extend in the second direction SD as the extending direction of the gate lines 20.

The block decoder 212 and the first pass transistor circuit 211A may be disposed on the first peripheral region PR1 of the substrate 10. While not shown, the global line controller 213 (see FIG. 3) may be additionally disposed on the first peripheral region PR1. The second pass transistor circuit 211B may be disposed on the second peripheral region PR2 of the substrate 10.

Each of the pass transistors TR1 to TR6 included in the first and second pass transistor circuits 211A and 211B may include a gate structure, a source S and a drain D which are formed in the substrate 10 at both sides of the gate structure. The gate structure includes a gate dielectric layer Gox, the gate electrode G1 or G2 and a gate mask layer HM which are sequentially stacked on the substrate 10.

A first interlayer dielectric layer ILD1 which covers the memory block BLKi, the first and second pass transistor circuits 211A and 211B and the block decoder 212 may be formed on the substrate 10. The first interlayer dielectric layer ILD1 may include a dielectric layer such as, for example, a silicon oxide layer.

Pad parts 84 may be formed on the channel structures CH, respectively. The pad parts 84 may include a polysilicon which is doped with an impurity. Bit line contacts 85 may be coupled to the pad parts 84, respectively, through the first interlayer dielectric layer ILD1. Bit lines BL which are coupled to the bit line contacts 85 may be formed on the first interlayer dielectric layer ILD1. The bit lines BL may be coupled to the channel structures CH through the bit line contacts 85 and the pad parts 84.

At the step portions of the gate lines 20, the contacts 41A and 41B may be coupled to the gate lines 20, respectively, through the first interlayer dielectric layer ILD1 in the first direction FD. In an embodiment, the contacts 41A may be disposed at the left step portions, respectively, of the source select line SSL and the word lines WL1 and WL2, and the contacts 41B may be disposed at the right step portions, respectively, of the word lines WL3 and WL4 and the drain select line DSL.

As shown in FIG. 5, the local row lines 51B which are coupled to the word lines WL3 and WL4 and the drain select line DSL, respectively, through the contacts 41B may be disposed on the first interlayer dielectric layer ILD1. The local row lines 51B may extend from the second extended region ER2 to the second peripheral region PR2 along the second direction SD. The contacts 42B which are coupled to the sources S, respectively, of the pass transistors TR4 to TR6 through the first interlayer dielectric layer ILD1 may be coupled to the respective ends of the local row lines 51B which are positioned on the second peripheral region PR2.

While not shown in FIG. 5, the local row lines 51A which are coupled to the source select line SSL and the word lines WL1 and WL2, respectively, through the contacts 41A may be disposed on the first interlayer dielectric layer ILD1. The local row lines 51A may extend from the first extended region ER1 to the first peripheral region PR1 along the second direction SD. The contacts 42A which are coupled to the sources S, respectively, of the pass transistors TR1 to TR3 through the first interlayer dielectric layer ILD1 may be coupled to the respective ends of the local row lines 51A which are positioned on the first peripheral region PR1.

On the block decoder 212, the contact 61 may be electrically coupled to the block decoder 212 through the first interlayer dielectric layer ILD1 in the first direction FD.

The first top wiring line 71 which is coupled to the block decoder 212 through the contact 61 may be formed on the first interlayer dielectric layer ILD1. The first top wiring line 71 may extend from the first peripheral region PR1 to the first extended region ER1 along the second direction SD, and may be disposed to overlap, in the first direction FD, with a portion of the gate electrode G1 of the pass transistors TR1 to TR3 included in the first pass transistor circuit 211A and one end of the wiring line 30 disposed on the first extended region ER1.

At the overlapping portion of the first top wiring line 71 and the gate electrode G1, the contact 62 which couples the first top wiring line 71 and the gate electrode G1 may be formed through the first interlayer dielectric layer ILD1 and the gate mask layer HM in the first direction FD. At the overlapping portion of the first top wiring line 71 and the wiring line 30, the contact 63 which electrically couples the first top wiring line 71 and the wiring line 30 may be formed through the first interlayer dielectric layer ILD1 and the uppermost first dielectric layer 21 in the first direction FD.

The second top wiring line 72 which is coupled to the other end of the wiring line 30 through the contact 64 may be formed on the first interlayer dielectric layer ILD1. The second top wiring line 72 may extend from the second extended region ER2 to the second peripheral region PR2 along the second direction SD, and may be disposed in such a way as to overlap with the portion of the gate electrode G2 of the pass transistors TR4 to TR6 included in the second pass transistor circuit 211B.

At the overlapping portion of the second top wiring line 72 and the gate electrode G2, the contact 65 which electrically couples the second top wiring line 72 and the gate electrode G2 may be formed through the first interlayer dielectric layer ILD1 and the gate mask layer HM in the first direction FD.

By this structure, the gate electrode G2 of the pass transistors TR4 to TR6 disposed on the second peripheral region PR2 may be electrically coupled to the block decoder 212 through the contact 65, the second top wiring line 72, the contact 64, the wiring line 30, the contact 63, the first top wiring line 71 and the contact 61, and may be provided with the block select signal from the block decoder 212. In other words, the block select signal from the block decoder 212 which is disposed on the first peripheral region PR1 may be transferred to the pass transistors TR4 to TR6 which are disposed on the second peripheral region PR2, through the wiring line 30 which is formed at the same layer as the drain select line DSL.

If, unlike the present embodiment, a wiring line for transferring the block select signal from the block decoder 212 disposed on the first peripheral region PR1 to the pass transistors TR4 to TR6 on the second peripheral region PR2 is formed in a wiring layer over the memory block BLKi, this would be problematic. The wiring line for transferring the block select signal to the pass transistors TR4 to TR6 would need to have a shape which traverses the cell region CR and the first and second extended regions ER1 and ER2 in the second direction SD from the first peripheral region PR1 on which the block decoder 212 is positioned to the second peripheral region PR2 on which the pass transistors TR4 to TR6 are positioned. However, because the bit lines BL are disposed in the third direction TD in the cell region CR, in the case where the wiring line for transfer of the block select signal is formed at the same layer as the bit lines BL, a problem may be caused in that the wiring line for transfer of the block select signal is likely to be shorted with the bit lines BL. Therefore, the wiring line for transfer of the block select signal should be formed in a wiring layer different from the bit lines BL. Namely, in order for transfer of the block select signal, it is necessary to additionally form a separate wiring layer over the memory block BLKi. According to the present embodiment, the block select signal from the block decoder 212 may be transferred to the pass transistors TR4 to TR6 which are disposed on the second peripheral region PR2, through the wiring line 30 which is formed at the same layer as the drain select line DSL. Hence, it is not necessary to form a separate wiring layer over the memory block BLKi in order for transfer of the block select signal. Therefore, as the number of wiring lines over the memory block BLKi may be decreased, the thickness of the memory device may be reduced, and the cost for forming the wiring lines may be reduced.

While the embodiment described above with reference to FIGS. 4 to 7 illustrates a case where the wiring line 30 is used in transferring the block select signal from the block decoder 212 disposed on the first peripheral region PR1 to the pass transistors TR4 to TR6 disposed on the second peripheral region PR2, it is to be noted that the embodiment is not limited thereto. For example, the wiring line 30 may be used in transferring an operation voltage from the global line controller 213 (see FIG. 3) disposed on the first peripheral region PR1, to the pass transistors TR4 to TR6 disposed on the second peripheral region PR2.

Figure 8:
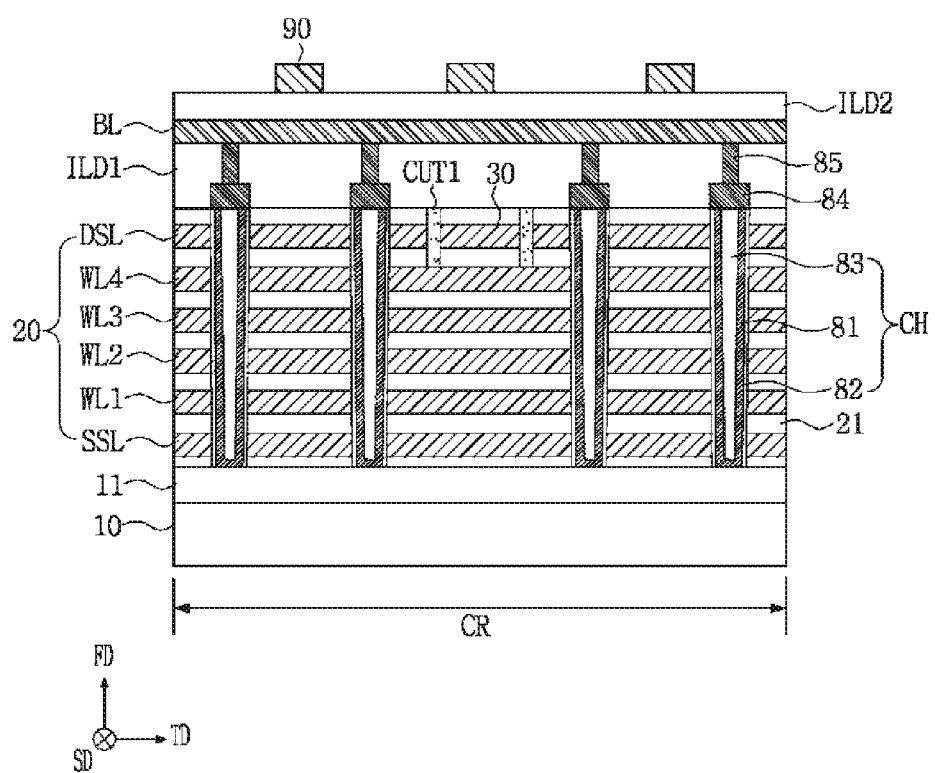
FIG. 8 is a cross-sectional view illustrating a representation of an example of a memory device in accordance with an embodiment.

FIG. 8 is a cross-sectional view illustrating a representation of an example of a memory device in accordance with an embodiment.

Referring to FIG. 8, a second interlayer dielectric layer ILD2 which covers the bit lines BL may be additionally formed on the first interlayer dielectric layer ILD1. Power lines 90 may be disposed on the second interlayer dielectric layer ILD2. In an embodiment, the power lines 90 may extend in the second direction SD, and be arranged along the third direction TD. In the present embodiment, the remaining components except the second interlayer dielectric layer ILD2 and the power lines 90 are substantially the same as those of the embodiment described above with reference to FIGS. 4 to 7.

As described above with reference to FIGS. 4 to 7, the block select signal from the block decoder 212 (see FIG. 4) which is disposed on the first peripheral region PR1 (see FIG. 4) may be transferred to the pass transistors TR4 to TR6 (see FIG. 4) which are disposed on the second peripheral region PR2 (see FIG. 4), through the wiring line 30 which is formed at the same layer as the drain select line DSL. Therefore, a space allocated on the memory block BLKi to form a wiring line for transfer of a block select signal may not be used anymore and be kept empty. In the present embodiment, the power lines 90 may be additionally disposed by utilizing the empty space. Therefore, even by not increasing the number of wiring layers, the resistance of power lines may be decreased, and thus, it is possible to stably provide power to the memory device.

Figure 9:
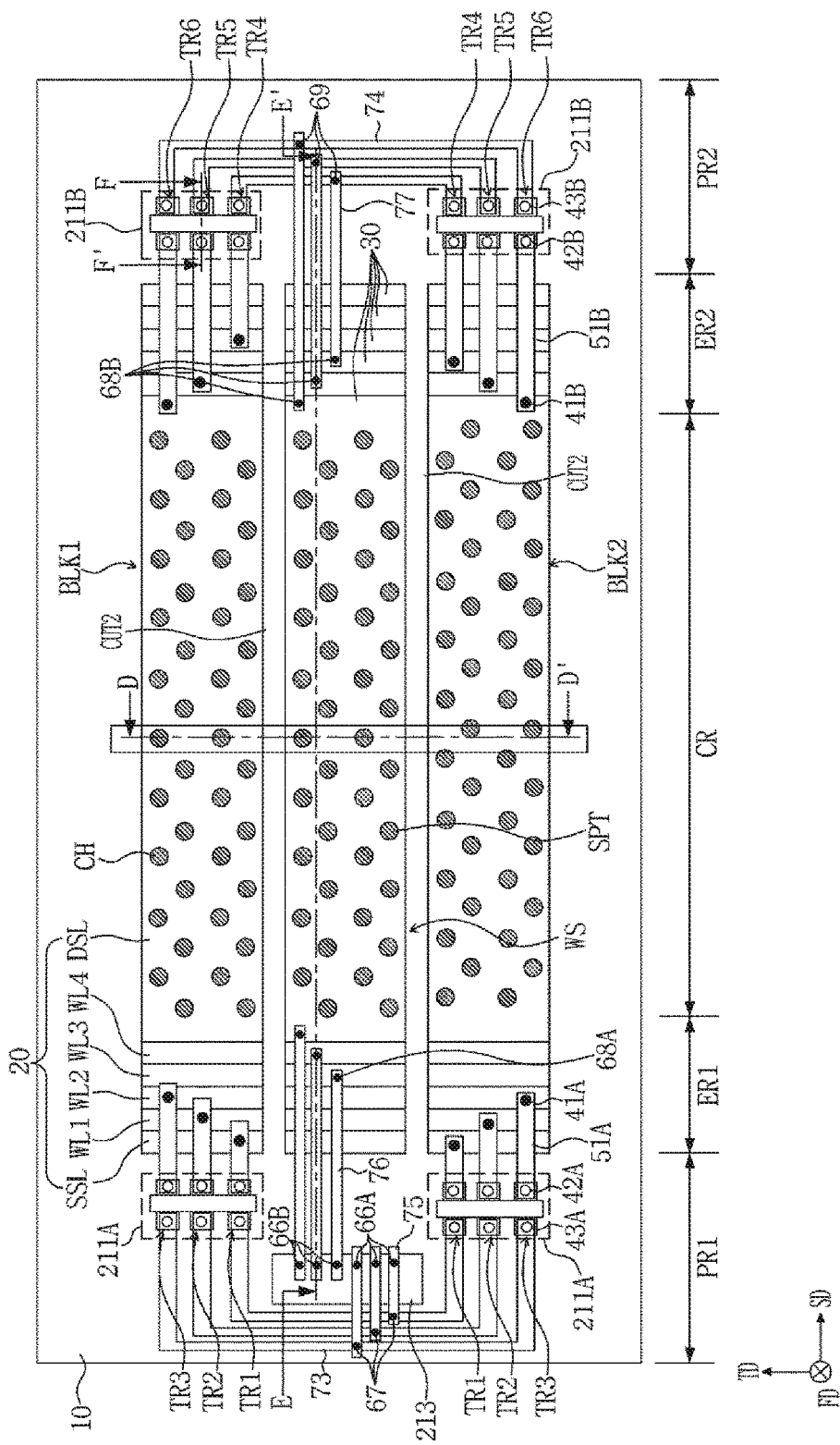
FIG. 9 is a top view illustrating a representation of an example of a memory device in accordance with an embodiment.

FIG. 9 is a top view illustrating a representation of an example of a memory device in accordance with an embodiment.

Referring to FIG. 9, a memory cell array may include memory blocks BLK1 and BLK2 and a wiring line stack WS. The memory blocks BLK1 and BLK2 and the wiring line stack WS may be disposed on a cell region CR and first and second extended regions ER1 and ER2.

The first and second memory blocks BLK1 and BLK2 may be arranged in the third direction TD. Each of the first and second memory blocks BLK1 and BLK2 may include a plurality of channel structures CH each extending in the first direction FD and a plurality of gate lines 20 which surround the channel structures CH and are stacked along the first direction FD.

The channel structures CH may be disposed in the cell region CR. The channel structures CH may be disposed in such a way as to be separated from one another along the second direction SD and the third direction TD. The channel structures CH may be disposed in a zigzag pattern along the third direction TD.

The gate lines 20 may be disposed in the cell region CR and the first and second extended regions ER1 and ER2 and extend along the second direction SD. The gate lines 20 may traverse the cell region CR along the second direction SD, and both ends of the gate lines 20 may be disposed on a first extended region ER1 and a second extended region ER2. The gate lines 20 may include at least one source select line SSL, a plurality of word lines WL1 to WL4 and at least one drain select line DSL which are sequentially stacked along the first direction FD.

The wiring line stack WS may be disposed adjacent to the memory blocks BLK1 and BLK2 in the third direction TD. In an embodiment, the wiring line stack WS may be disposed between the memory blocks BLK1 and BLK2.

The wiring line stack WS may include a plurality of wiring lines 30 which are sequentially stacked along the first direction FD. In an embodiment, the wiring lines 30 may be disposed at the same layers as the gate lines 20 of each of the memory blocks BLK1 and BLK2, that is, the source select line SSL, the word lines WL1 to WL4 and the drain select line DSL, respectively.

The wiring lines 30 may be disposed in the cell region CR and the first and second extended regions ER1 and ER2, and may extend along the second direction SD. The wiring lines 30 may traverse the cell region CR along the second direction SD, and both ends of the wiring lines 30 may be disposed on the first and second extended regions ER1 and ER2.

The wiring line stack WS may be separated from each of the memory blocks BLK1 and BLK2 by a cutting pattern CUT2 which extends in the second direction SD. As shown in FIG. 9, in the case where two cutting patterns CUT2 are formed, two memory blocks and one wiring line stack may be defined. The number of the cutting patterns, the memory blocks and the wiring line stack are for an illustration purpose only, and it is to be noted that the embodiment is not limited thereto.

The gate lines 20 may extend by different lengths along the second direction SD, and thus, step portions may be formed at both ends of the gate lines 20 which are disposed on the first and second extended regions ER1 and ER2. The step portions of the gate lines 20 may be disposed on the first and second extended regions ER1 and ER2.

Similarly to the gate lines 20, the wiring lines 30 may extend by different lengths along the second direction SD, and thus, step portions may be formed at both ends of the wiring lines 30 which are disposed on the first and second extended regions ER1 and ER2. The step portions of the wiring lines 30 may be disposed on the first and second extended regions ER1 and ER2.

At least one support SPT may be formed through the wiring lines 30 of the wiring line stack WS in the first direction FD. In an embodiment, a plurality of supports SPT may be provided. The supports SPT may be disposed in the cell region CR. The supports SPT may be disposed in such a way as to be separated from one another along the second direction SD and the third direction TD. The supports SPT may be disposed in a zigzag pattern along the third direction TD as shown in FIG. 9.

First pass transistor circuits 211A and a global line controller 213 may be disposed on the first peripheral region PR1, and second pass transistor circuits 211B may be disposed on the second peripheral region PR2. While not shown, a block decoder (see the reference numeral 212 of FIG. 3) may be additionally disposed on the first peripheral region PR1.

The first and second pass transistor circuits 211A and 211B may be provided for each of the memory blocks BLK1 and BLK2, and the global line controller 213 may be provided in common for the memory blocks BLK1 and BLK2.

Each of the first pass transistor circuits 211A may be disposed at the left side of a corresponding memory block (any one of the memory blocks BLK1 and BLK2), and each of the second pass transistor circuits 211B may be disposed at the right side of a corresponding memory block (any one of the memory blocks BLK1 and BLK2).

Local row lines 51A may be coupled to the left step portions, respectively, of the source select line SSL and the word lines WL1 and WL2 through contacts 41A. The local row lines 51A may extend from the first extended region ER1 to the first peripheral region PR1 along the second direction SD. The local row lines 51A may be coupled to the sources of pass transistors TR1 to TR3 included in the first pass transistor circuit 211A, through contacts 42A.

Local row lines 51B may be coupled to the right step portions, respectively, of the word lines WL3 and WL4 and the drain select line DSL through contacts 41B. The local row lines 51B may extend from the second extended region ER2 to the second peripheral region PR2 along the second direction SD. The local row lines 51B may be coupled to the sources of pass transistors TR4 to TR6 included in the second pass transistor circuit 211B, through contacts 42B.

First top wiring lines 73 may be coupled to the drains, respectively, of the pass transistors TR1 to TR3 included in the first pass transistor circuits 211A, through contacts 43A. The number of the first top wiring lines 73 may be determined by the number of the pass transistors TR1 to TR3 included in each of the first pass transistor circuits 211A. For example, three first top wiring lines 73 may be disposed in correspondence to the number of the pass transistors TR1 to TR3 included in each of the first pass transistor circuits 211A. Pass transistors which are included in the different first pass transistor circuits 211A and coupled to the gate lines disposed at the same layer may be coupled in common to one of the first top wiring lines 73.

Second top wiring lines 74 may be coupled to the drains, respectively, of the pass transistors TR4 to TR6 included in the second pass transistor circuits 211B, through contacts 43B. The number of the second top wiring lines 74 may be determined by the number of the pass transistors TR4 to TR6 included in each of the second pass transistor circuits 211B. For example, three second top wiring lines 74 may be disposed in correspondence to the number of the pass transistors TR4 to TR6 included in each of the second pass transistor circuits 211B. Pass transistors which are included in the different second pass transistor circuits 211B and coupled to the gate lines disposed at the same layer may be coupled in common to one of the second top wiring lines 74.

A plurality of contacts 66A and 66B which are electrically coupled to the global line controller 213 may be disposed on the global line controller 213. The global line controller 213 may be coupled to third top wiring lines 75, respectively, through the contacts 66A. The third top wiring lines 75 may correspond to the first top wiring lines 73, respectively. The third top wiring lines 75 may be electrically coupled to the corresponding first top wiring lines 73, respectively, through contacts 67. By this structure, the drains of the pass transistors TR1 to TR3 disposed on the first peripheral region PR1 may be electrically coupled to the global line controller 213 through the contacts 43A, the first top wiring lines 73, the contacts 67, the third top wiring lines 75 and the contacts 66A, and may be provided with an operation voltage from the global line controller 213.

The global line controller 213 may be coupled to fourth top wiring lines 76, respectively, through the contacts 66B. The fourth top wiring lines 76 may extend from the first peripheral region PR1 to the first extended region ER1 along the second direction SD, and may be coupled to corresponding wiring lines 30 through contacts 68A on the first extended region ER1.

Fifth top wiring lines 77 may be coupled to the second top wiring lines 74, respectively, through contacts 69 on the second peripheral region PR2. The fifth top wiring lines 77 may extend from the second peripheral region PR2 to the second extended region ER2 along the second direction SD, and may be coupled to corresponding wiring lines 30, respectively, through contacts 68B on the second extended region ER2. By this structure, the drains of the pass transistors TR4 to TR6 disposed on the second peripheral region PR2 may be electrically coupled to the global line controller 213 through the contacts 43B, the second top wiring lines 74, the contacts 69, the fifth top wiring lines 77, the contacts 68B, the wiring lines 30, the contacts 68A, the fourth top wiring lines 76 and the contacts 66B, and may be provided with an operation voltage from the global line controller 213.

Figure 10:
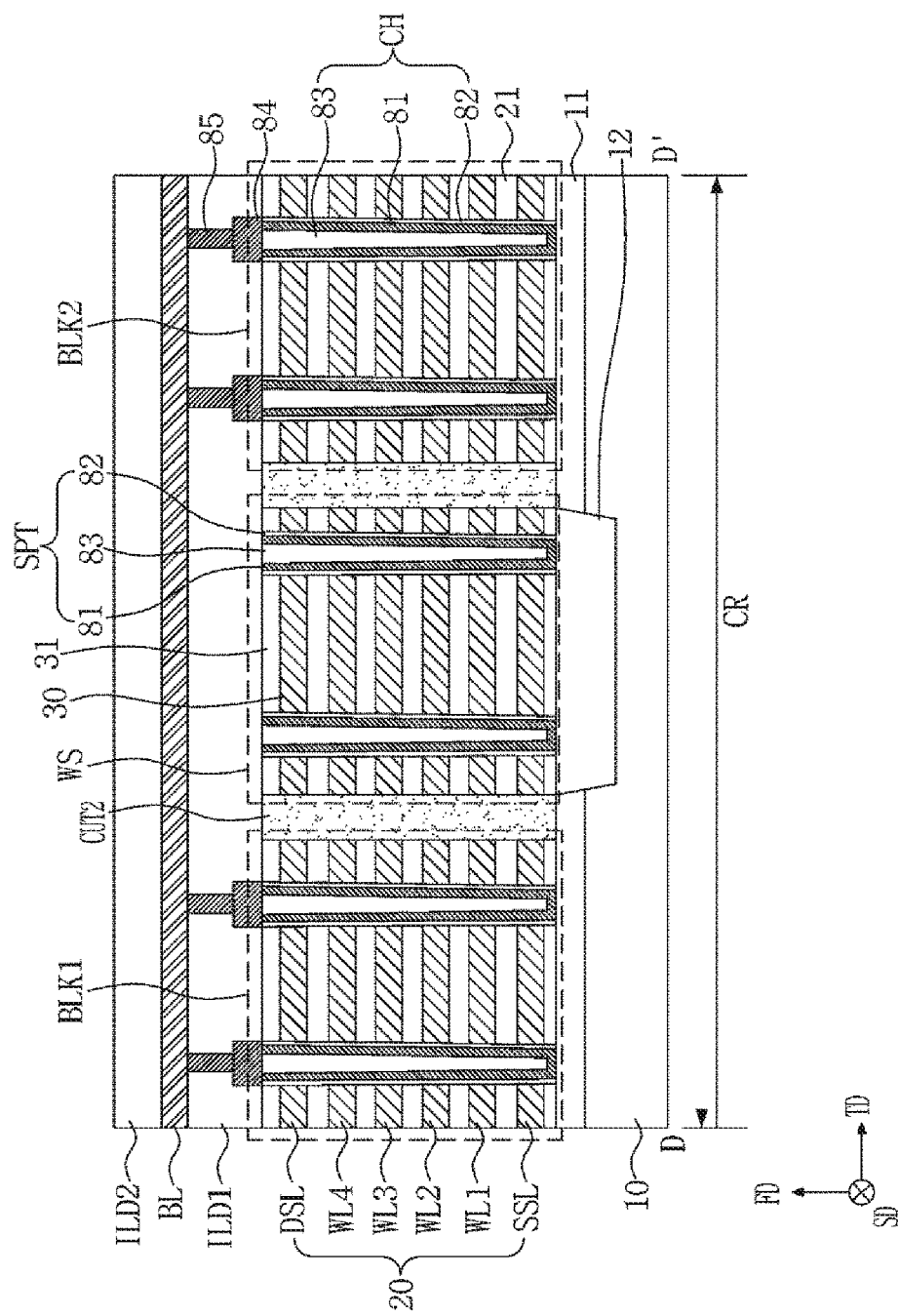
FIG. 10 is a cross-sectional view taken along the line D-D' of FIG. 9.

Hereunder, the components of the memory device in accordance with the embodiment of the present disclosure will be described in further detail with additional reference to FIGS. 10 and 11. FIG. 10 is a cross-sectional view taken along the line D-D' of FIG. 9, and FIG. 11 is a cross-sectional view taken along the lines E-E' and F-F' of FIG. 9.

Figure 11:
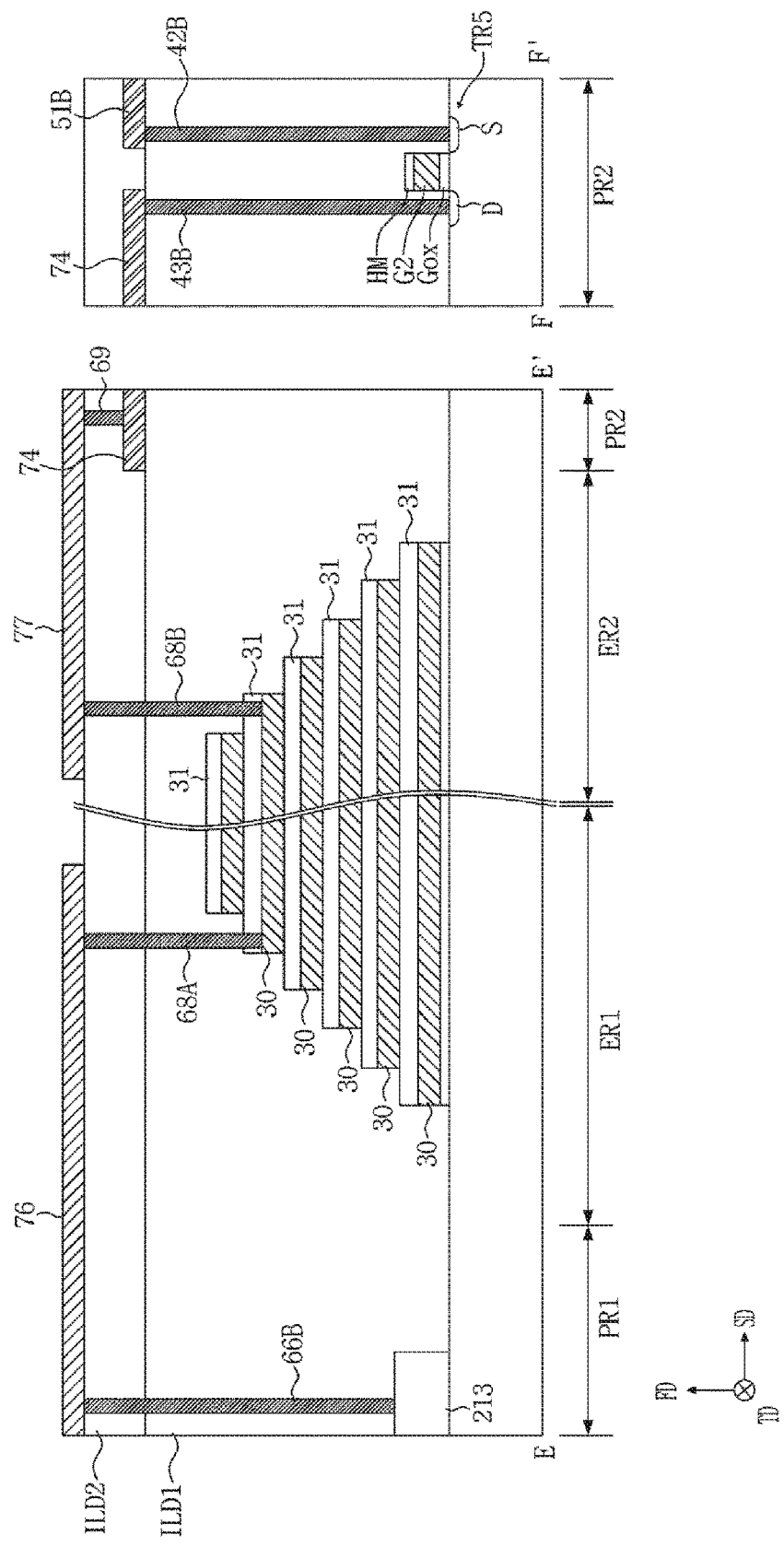
FIG. 11 is a cross-sectional view taken along the lines E-E' and F-F' of FIG. 9.

Referring to FIGS. 9 to 11, the memory blocks BLK1 and BLK2 and the wiring line stack WS may be disposed in the cell region CR and the first and second extended regions ER1 and ER2 of a substrate 10.

Each of the memory blocks BLK1 and BLK2 may include the plurality of channel structures CH which extend in the first direction FD and the gate lines 20 and first dielectric layers 21 which surround the channel structures CH and are alternately stacked along the first direction FD.

Each of the channel structures CH may include a channel layer 81 and a gate dielectric layer 82 which is disposed between the channel layer 81 and the gate lines 20. The channel layer 81 may include a polysilicon or monocrystalline silicon, and may include a P-type impurity such as boron (B) in some regions.

The channel layer 81 may have the shape of a tube in which a center region is open. A buried dielectric layer 83 may be formed in the open center region of the channel layer 81. In an embodiment, the channel layer 81 may have the shape of a pillar which is completely filled up to its center or a solid cylinder, and in this case, the buried dielectric layer 83 may be omitted. The gate dielectric layer 82 may have the shape of a straw or a cylindrical shell which surrounds the outer wall of the channel layer 81.

The gate lines 20 may be disposed in the cell region CR and the first and second extended regions ER1 and ER2 of the substrate 10. The gate lines 20 may include at least one source select line SSL, a plurality of word lines WL and at least one drain select line DSL. The source select line SSL, the word lines WL and the drain select line DSL may be sequentially disposed along the first direction FD. The gate lines 20 may include a metallic material or a polysilicon.

Source select transistors SST (see FIG. 2) may be formed where the source select line SSL surrounds the channel structures CH, memory cells MC (see FIG. 2) may be formed where the word lines WL surround the channel structures CH, and drain select transistors DST (see FIG. 2) may be formed where the drain select line DSL surrounds the channel structures CH. By the above-described structure, cell strings including source select transistors, memory cells and drain select transistors which are disposed along the channel structures CH may be constructed.

The gate lines 20 may be stacked in a shape of which length gradually decreases along the second direction SD from the top surface of the substrate 10. The gate lines 20 may be stacked in a step-like shape or a pyramid shape. Due to this fact, on the first and second extended regions ER1 and ER2, each of the gate lines 20 may have step portions which project out of the gate line 20 of an upper layer in the second direction SD.

The wiring line stack WS may be disposed adjacent to the memory blocks BLK1 and BLK2 in the third direction TD.

In an embodiment, the wiring line stack WS may be disposed between the memory blocks BLK1 and BLK2.

The wiring line stack WS may include the plurality of wiring lines 30 and second dielectric layers 31 which are alternately stacked along the first direction FD. The wiring lines 30 may be coextensive in the second direction SD to corresponding gate lines 20.

In an embodiment, the wiring line stack WS may be separated from the memory blocks BLK1 and BLK2 by the cutting patterns CUT2 which extend in the second direction SD. The cutting patterns CUT2 may include a dielectric layer such as a silicon oxide layer. The wiring lines 30 of the wiring line stack WS may be separated from the gate lines 20 of the memory blocks BLK1 and BLK2 by the cutting patterns CUT2.

The wiring lines 30 may be disposed at the same layers as the gate lines 20, respectively. The second dielectric layers 31 may be disposed at the same layers as the first dielectric layers 21, respectively. The gate line 20 and the wiring line 30 disposed at the same layer may be generated at the same processing step. Due to this fact, the heights and materials of the gate line 20 and the wiring line 30 which are disposed at the same layer may be the same with each other. The first dielectric layer 21 and the second dielectric layer 31 disposed at the same layer may be generated at the same processing step. Due to this fact, the heights and materials of the first dielectric layer 21 and the second dielectric layer 31 which are disposed at the same layer may be the same with each other.

Similarly to the gate lines 20, the wiring lines 30 may be stacked in a shape of which length along the second direction SD gradually decreases from the top surface of the substrate 10. For example, as shown in FIG. 11, the wiring lines 30 may be stacked in a step-like shape or a pyramid shape. Due to this fact, on the first and second extended regions ER1 and ER2, each of the wiring lines 30 may have step portions which project out of the wiring line 30 of an upper layer in the second direction SD.

The wiring line stack WS may further include the plurality of supports SPT which pass through the wiring lines 30 and the second dielectric layers 31 in the first direction FD. The supports SPT may have the shape of a cylinder. In an embodiment, the supports SPT may be formed at the same processing step as the channel structures CH. In this case, the supports SPT may have the same structure as the channel structures CH. Meanwhile, the supports SPT may be formed at a different processing step from the channel structures CH. In this case, the supports SPT may have a structure different from the channel structures CH.

As an N-type impurity or a P-type impurity is implanted into the substrate 10 under the memory blocks BLK1 and BLK2, a well region 11 may be formed. An isolation structure 12 which is electrically decoupled from the well region 11 may be formed in the substrate 10 under the wiring line stack WS. The isolation structure 12 may be constructed by a dielectric layer such as a silicon oxide layer. The isolation structure 12 may be constructed by an impurity region which is doped into a conductivity type opposite to the well region 11. The bottom surfaces of the channel structures CH may be contacted with the well region 11, and the bottom surfaces of the supports SPT may be contacted with the isolation structure 12.

The global line controller 213 and the first pass transistor circuit 211A may be disposed on the first peripheral region PR1 of the substrate 10, and the second pass transistor circuit 211B may be disposed on the second peripheral region PR2 of the substrate 10. While not shown, a block decoder (see the reference numeral 212 of FIG. 3) may be additionally disposed on the first peripheral region PR1.

Each of the pass transistors TR1 to TR6 included in the first and second pass transistor circuits 211A and 211B may include a gate structure, and a source S and a drain D which are formed in the substrate 10 at both sides of the gate structure. The gate structure includes a gate dielectric layer Gox, a gate electrode G1 or G2 and a gate mask layer HM which are sequentially stacked on the substrate 10.

A first interlayer dielectric layer ILD1 which covers the memory blocks BLK1 and BLK2, the first and second pass transistor circuits 211A and 211B and the global line controller 213 may be formed on the substrate 10. The first interlayer dielectric layer ILD1 may include a dielectric layer such as, for example, a silicon oxide layer.

Pad parts 84 may be formed on the channel structures CH, respectively. The pad parts 84 may include a polysilicon which is doped with an impurity. Bit line contacts 85 may be coupled to the pad parts 84, respectively, through the first interlayer dielectric layer ILD1. Bit lines BL which are coupled to the bit line contacts 85 may be formed on the first interlayer dielectric layer ILD1. The channel structures CH may be electrically coupled to the bit lines BL through the pad parts 84 and the bit line contacts 85.

The pad parts 84 and the bit line contacts 85 are not formed over the supports SPT. The supports SPT may be electrically and physically decoupled from the bit lines BL by the first interlayer dielectric layer ILD1.

As shown in FIG. 11, the second top wiring lines 74 which are coupled to the drains D, respectively, of the pass transistors TR4 to TR6 through the contacts 43B may be disposed on the first interlayer dielectric layer ILD1 on the second peripheral region PR2. While not shown in FIG. 11, the first top wiring lines 73 which are electrically coupled to the drains D, respectively, of the pass transistors TR1 to TR3 through the contacts 43A may be disposed on the first interlayer dielectric layer ILD1 on the first peripheral region PR1.

A second interlayer dielectric layer ILD2 which covers the bit lines BL, the first top wiring lines 73 and the second top wiring lines 74 may be formed on the first interlayer dielectric layer ILD1. The second interlayer dielectric layer ILD2 may include a dielectric layer such as, for example, a silicon oxide layer.

The contacts 66B which are electrically coupled to the global line controller 213 through the first and second interlayer dielectric layers ILD1 and ILD2 may be formed on the global line controller 213.

The global line controller 213 may be electrically coupled to fourth top wiring lines 76 formed on the second interlayer dielectric layer ILD2, through the contact 66B. The fourth top wiring lines 76 may extend from the first peripheral region PR1 to the first extended region ER1 along the second direction SD.

The contacts 68A which are coupled to the wiring lines 30 through the first and second interlayer dielectric layers ILD1 and ILD2 may be coupled to the respective ends of the fourth top wiring lines 76 on the first extended region ER1.

The wiring lines 30 may extend from the first extended region ER1 to the second extended region ER2 by traversing the cell region CR in the second direction SD. The contacts 68B which are coupled to the fifth top wiring lines 77 through the first and second interlayer dielectric layers ILD1 and ILD2 may be coupled to the respective ends of the wiring lines 30 on the second extended region ER2.

The fifth top wiring lines 77 may be disposed on the second interlayer dielectric layer ILD2, and may extend from the second extended region ER2 to the second peripheral region PR2 along the second direction SD. The contacts 69 which are coupled to the second top wiring lines 74 through the second interlayer dielectric layer ILD2 may be coupled to the ends of the fifth top wiring lines 77 on the second peripheral region PR2.

The second top wiring lines 74 may be disposed on the second peripheral region PR2, and the contacts 43B which are coupled to the drains D of the pass transistors TR4 to TR6 through the first interlayer dielectric layer ILD1 may be coupled to the second top wiring lines 74.

By this structure, the drains D of the pass transistors TR4 to TR6 disposed on the second peripheral region PR2 may be electrically coupled to the global line controller 213 through the contacts 43B, the second top wiring lines 74, the contacts 69, the fifth top wiring lines 77, the contacts 68B, the wiring lines 30, the contacts 68A, the fourth top wiring lines 76 and the contacts 66B, and may be provided with an operation voltage from the global line controller 213.

If unlike the present embodiment, wiring lines for transferring an operation voltage from the global line controller 213 to the pass transistors disposed on the second peripheral region PR2 are formed in a wiring layer over memory blocks then in order to improve the degree of integration, the stack number of word lines should be increased. If the stack number of word lines is increased, the number of pass transistors should also be increased to correspond to the increased number of word lines. According to this fact, the number of the pass transistors disposed on the second peripheral region PR2 increases, and the number of wiring lines for transferring an operation voltage from the global line controller 213 to the pass transistors disposed on the second peripheral region PR2 increases as well. If the number of wiring lines increases, since it may be impossible to dispose all wiring lines in one wiring layer, two or more wiring layers may be needed.

According to the present embodiment, an operation voltage from the global line controller 213 may be transferred to the pass transistors TR4 to TR6 which are disposed on the second peripheral region PR2, through the wiring lines 30 which are formed at the same layers as the gate lines of a memory block. Therefore, it is not necessary to form a separate wiring layer over a memory block BLKi, to transfer an operation voltage to the pass transistors TR4 to TR6 disposed on the second peripheral region PR2. Consequently, as the number of wiring lines over the memory block BLKi is decreased, the thickness of the memory device may be reduced, and the cost for forming the wiring lines may be reduced.

In the embodiment described above with reference to FIGS. 9 to 11 the wiring lines 30 included in the wiring line stack WS are used to transfer an operation voltage from the global line controller 213 disposed on the first peripheral region PR1, to the pass transistors TR4 to TR6 disposed on the second peripheral region PR2. However, it is to be noted that the embodiment is not limited in this way. For example, in a modified embodiment, the wiring lines 30 included in the wiring line stack WS may be used for transferring a block select signal from the block decoder 212 disposed on the first peripheral region PR1, to the pass transistors TR4 to TR6 disposed on the second peripheral region PR2.

Also, while it was explained in the embodiment described above with reference to the drawings that the extending direction of the wiring lines 30 is the same as the extending direction of the gate lines 20, it is to be noted that the embodiment is not limited in this way, and thus the extending direction of the wiring lines 30 may be different from the extending direction of the gate lines 20. For example, the gate lines 20 may extend in the second direction SD, and the wiring lines 30 may extend in the third direction TD.

Figure 12:
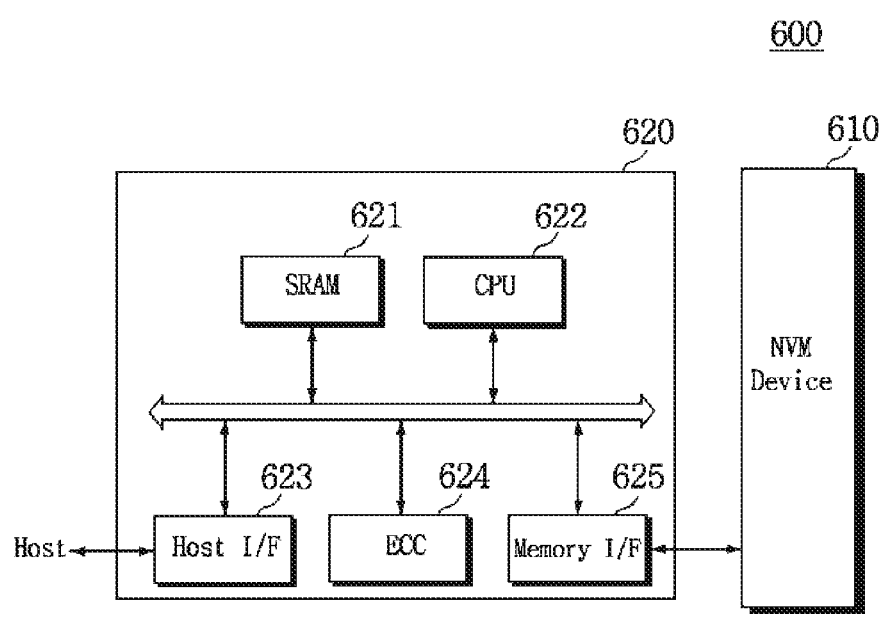
FIG. 12 is a simplified block diagram schematically illustrating a memory system including a memory device in accordance with an embodiment.

FIG. 12 is a simplified block diagram schematically illustrating a memory system including a memory device according to an embodiment of the present invention.

Referring to FIG. 12, the memory system 600 may include the semiconductor memory device 610 and a memory controller 620.

The semiconductor memory device 610 may comprise the memory device according to an embodiment of the invention as described above, and may be operated in the manner described above. The memory controller 620 may control the semiconductor memory device 610. For example, the combination of the semiconductor memory device 610 and the memory controller 620, may be configured as a memory card or a solid-state disk (SSD). The memory controller 620 may include an SRAM 621, a central processing unit (CPU) 622, a host interface 623, an ECC block 624, a memory interface 625 operatively coupled via an internal bus.

The SRAM 621 may be used as the working memory of the CPU 622. The host interface 623 may include the data exchange protocol of a host which may be coupled with the memory system 600.

The ECC block 624 may detect and correct an error included in the data read out from the semiconductor memory device 610.

The memory interface 625 may interface with the semiconductor memory device 610. The CPU 622 may perform general control operations for data exchange of the memory controller 620.

Although not shown, it should become apparent to a person skilled in the art that the memory system 600 may further be provided with a ROM which stores code data for interfacing with the host. The semiconductor memory device 610 may be provided as a multi-chip package constructed by a plurality of flash memory chips.

The memory system 600 may be used as a storage medium of high reliability having a low probability of an error occurring. The aforementioned nonvolatile memory device may be provided for a memory system such as a solid state disk (SSD). The memory controller 620 may communicate with an external device (for example, the host) through one of various interface protocols such as a USB (universal serial bus) protocol, an MMC (multimedia card) protocol, a PCI-E (peripheral component interconnection express) protocol, an SATA (serial advanced technology attachment) protocol, a PATA (parallel advanced technology attachment) protocol, an SCSI (small computer system interface) protocol, an ESDI (enhanced small disk interface) protocol and an IDE (integrated device electronics) protocol and the like.

Figure 13:
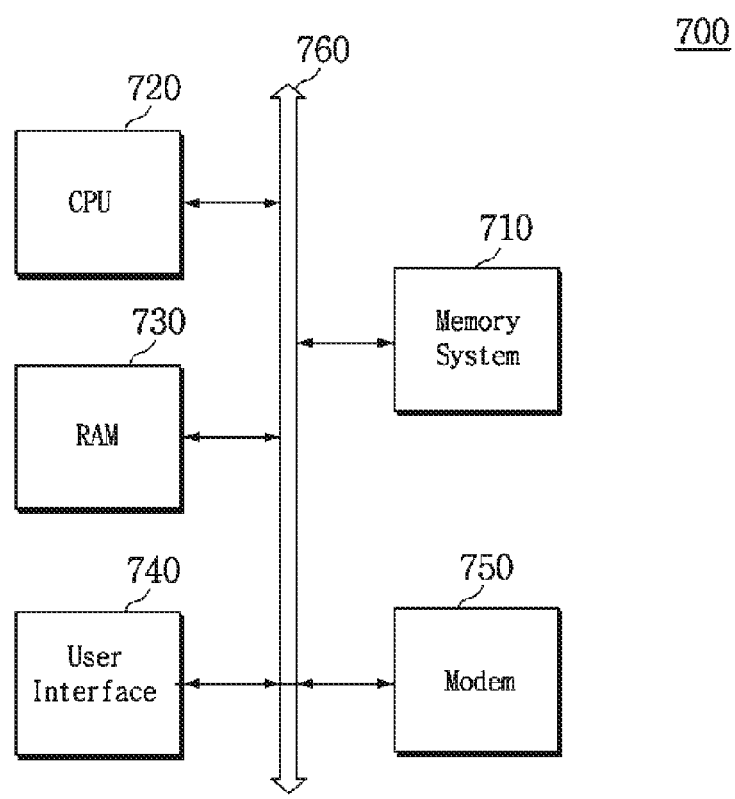
FIG. 13 is a block diagram schematically illustrating a computing system including a memory device in accordance with an embodiment.

FIG. 13 is a simplified block diagram schematically illustrating a computing system including a memory device, according to an embodiment of the present invention.

Referring to FIG. 13, a computing system 700 according to an embodiment may include a memory system 710, a microprocessor (or CPU) 720, a RAM 730, a user interface 740, a modem 750 such as a baseband chipset, and, which are electrically coupled to a system bus 760. In an embodiment, the computing system 700 may be a mobile device, in which case a battery (not shown) for supplying the operating voltage of the computing system 700 may be additionally provided. Although not shown in the drawing, it should become apparent to a person skilled in the art that the computing system 700 may further comprise an application chipset, a COMS image sensor (CIS), a mobile DRAM, and so on. The memory system 710 may be configured, for example, as an SSD (solid state drive/disk) which uses a nonvolatile memory to store data. Also as an example, the memory system 710 may be provided as a fusion flash memory (for example, a NAND or a NOR flash memory).

It is further noted that it is not intended that the above-described embodiments are realized only by a device and a method, and they may be realized also by a program which performs a function corresponding to the configuration of each embodiment or a recording medium on which the program is recorded. Such realization may be easily derived from the descriptions of the above-described embodiments by a person skilled in the art to which the embodiments pertain.

Although various embodiments have been described for illustrative purposes, it will be apparent to those skilled in the art that various changes and modifications may be made without departing from the spirit and scope of the invention as defined in the following claims.

What is claimed is:

1. A memory device comprising:
   a substrate;
   channel structures disposed over the substrate and extending in a first direction perpendicular to a top surface of the substrate;
   a plurality of gate lines stacked over the substrate along the first direction, the gate lines surrounding the channel structures, wherein the gate lines extend in a second direction that is parallel to the top surface of the substrate;
   at least one wiring line formed at a respective layer of at least one of the gate lines by separating the at least one wiring line from the respective layer of the at least one of the gate lines with a cutting pattern, wherein the at least one wiring line extends in the second direction;
   a block decoder disposed at one side of the gate lines and the at least one wiring line in the second direction; and
   a pass transistor disposed at the other side of the gate lines and the at least one wiring line in the second direction, coupled to one of the gate lines and electrically coupled to the block decoder through the at least one wiring line, and transferring an operation voltage to the gate line in response to a block select signal provided from the block decoder.

2. The memory device according to claim 1,
   wherein the gate lines include at least one source select line, a plurality of word lines and at least one drain select line which are sequentially stacked along the first direction, and
   wherein one of the at least one wiring line is formed at a layer of the drain select line.

3. The memory device according to claim 2, wherein the at least one wiring line overlaps with the source select line and the word lines in the first direction.

4. The memory device according to claim 1,
   wherein the gate lines include at least one source select line, a plurality of word lines and at least one drain select line which are sequentially stacked along the first direction, and
   wherein the at least one wiring line is formed at each layer of the source select line, the word lines and the drain select line, respectively.

5. The memory device according to claim 1, wherein the cutting pattern is formed of a dielectric material.

6. A memory device comprising:
   a substrate;

channel structures disposed over the substrate and extending in a first direction perpendicular to a top surface of the substrate;
a plurality of gate lines stacked over the substrate along the first direction, the gate lines surrounding the channel structures, wherein the gate lines extend in a second direction that is parallel to the top surface of the substrate;
at least one wiring line formed at a respective layer of at least one of the gate lines by separating the at least one wiring line from the respective layer of the at least one of the gate lines with a cutting pattern, wherein the at least one wiring line extends in the second direction;
a global line controller disposed at one side of the gate lines and the at least one wiring line in the second direction; and
a pass transistor disposed at the other side of the gate lines and the at least one wiring line in the second direction, coupled to one of the gate lines and electrically coupled to the global line controller through the at least one wiring line, and transferring an operation voltage provided from the global line controller to the gate line.

7. A memory device comprising:
a substrate;
a memory block stacked over the substrate in a first direction perpendicular to a top surface of the substrate, the memory block comprising:
  channel structures extending in the first direction;
  at least one source select line, a plurality of word lines and at least one drain select line surrounding the channel structures and stacked along the first direction, wherein the at least one source select line, the plurality of word lines and the at least one drain select line extend in a second direction that is parallel to the top surface of the substrate; and
  a wiring line formed at a layer of the drain select line by separating the wiring line from the layer of the drain select line with a cutting pattern, wherein the wiring line extends in the second direction,
a block decoder disposed at one side of the memory block in the second direction; and
a pass transistor disposed at the other side of the memory block in the second direction, coupled to one of the at least one source select line, the plurality of word lines and the at least one drain select line and electrically coupled to the block decoder through the wiring line, and transferring an operation voltage to the one of the at least one source select line, the plurality of word lines and the at least one drain select line in response to a block select signal provided from the block decoder.

8. A memory device comprising:
a substrate;
a memory cell array stacked over the substrate in a first direction perpendicular to a top surface of the substrate, the memory cell array comprising:
  a memory block including channel structures which extend in the first direction and a plurality of gate lines which surround the channel structures and are stacked over the substrate along the first direction, wherein the gate lines extend in a second direction that is parallel to the top surface of the substrate; and
  a wiring line stack including a plurality of wiring lines which are stacked over the substrate along the first direction, wherein each of the plurality of wiring lines is formed at a layer of a respective gate line, wherein the wiring lines extend in the second direction,
a block decoder disposed at one side of the memory cell array in the second direction; and
a pass transistor disposed at the other side of the memory cell array in the second direction, coupled to one of the gate lines and electrically coupled to the block decoder through one of the wiring lines, and transferring an operation voltage to the gate line in response to a block select signal provided from the block decoder.

9. The memory device according to claim 8, further comprising:
a well region formed in the substrate, and overlapping with the memory block in the first direction; and
an isolation structure formed in the substrate, overlapping with the wiring line stack in the first direction, and electrically decoupled from the well region.

10. The memory device according to claim 8, further comprising:
supports passing through the wiring line stack in the first direction.

11. The memory device according to claim 10, wherein the supports have the same structure as the channel structures.

12. The memory device according to claim 10, further comprising:
an interlayer dielectric layer formed over the substrate to cover the memory cell array;
a plurality of bit lines formed over the interlayer dielectric layer; and
bit line contacts disposed over the channel structures, respectively, and electrically coupling the channel structures to the bit lines through the interlayer dielectric layer,
wherein the supports are electrically decoupled from the bit lines by the interlayer dielectric layer.

13. A memory device comprising:
a substrate;
a memory cell array stacked over the substrate in a first direction perpendicular to a top surface of the substrate, the memory cell array comprising:
  a memory block including channel structures which extend in the first direction and a plurality of gate lines which surround the channel structures and are stacked over the substrate along the first direction, wherein the gate lines extend in a second direction that is parallel to the top surface of the substrate; and
  a wiring line stack including a plurality of wiring lines which are stacked over the substrate along the first direction, wherein each of the plurality of wiring lines is formed at a layer of a respective gate line, wherein the wiring lines extend in the second direction,
a global line controller disposed at one side of the memory cell array in the second direction that is parallel to the top surface of the substrate; and
a pass transistor disposed at the other side of the memory cell array in the second direction, coupled to one of the gate lines and electrically coupled to the global line controller through one controller to of the wiring lines, and transferring an operation voltage provided from the global line controller to the gate line.

14. A memory device comprising:
a substrate;
a memory block stacked over the substrate in a first direction perpendicular to a top surface of the substrate, the memory block comprising:
channel structures extending in the first direction;

at least one source select line, a plurality of word lines and at least one drain select line surrounding the channel structures and stacked along the first direction, wherein the at least one source select line, the plurality of word lines and the at least one drain select line extend in a second direction that is parallel to the top surface of the substrate; and a wiring line formed at a layer of the drain select line by separating the wiring line from the layer of the drain select line with a cutting pattern, wherein the wiring line extends in the second direction, a global line controller disposed at one side of the memory block in the second direction; and a pass transistor disposed at the other side of the memory block in the second direction, coupled to one of the at least one source select line, the plurality of word lines and the at least one drain select line and electrically coupled to the global line controller through the wiring line, and transferring an operation voltage provided from the global line controller one of the at least one source select line, the plurality of word lines and the at least one drain select line.

* * * * *